United States Patent [19]
Perkins

[11] Patent Number: 5,646,580
[45] Date of Patent: Jul. 8, 1997

[54] METHOD AND APPARATUS FOR SWITCHING CRYSTALS IN A CRYSTAL CONTROLLED OSCILLATOR

[75] Inventor: Geoffrey W. Perkins, Chandler, Ariz.

[73] Assignee: Motorola, Inc., Schaumburg, Ill.

[21] Appl. No.: 610,006

[22] Filed: Mar. 4, 1996

[51] Int. Cl.[6] .................................................. H03B 5/36
[52] U.S. Cl. ..................... 331/116 R; 331/158; 331/161; 331/179
[58] Field of Search ................... 331/116 R, 116 PE, 331/158, 161, 162, 179; 310/318

[56] References Cited

U.S. PATENT DOCUMENTS

| | | |
|---|---|---|
| 3,233,191 | 2/1966 | Brian .......................... 331/161 |
| 3,495,187 | 2/1970 | Jezierski et al. ............ 331/161 X |
| 3,581,239 | 5/1971 | Knutson ..................... 331/161 X |
| 3,614,667 | 10/1971 | Fletcher .................... 331/161 X |
| 3,626,330 | 12/1971 | Zalonis ...................... 331/161 X |
| 3,763,440 | 10/1973 | Garcia et al. .............. 331/161 X |
| 3,854,093 | 12/1974 | Schonegg .................. 331/161 X |
| 4,442,415 | 4/1984 | Ashida ....................... 331/161 X |
| 4,571,558 | 2/1986 | Gay et al. ................... 331/105 |
| 4,574,255 | 3/1986 | Fujii et al. .................. 331/161 X |
| 4,646,033 | 2/1987 | Perkins ...................... 331/116 R |
| 5,150,079 | 9/1992 | Williams et al. ........... 331/75 |

Primary Examiner—David Mis
Attorney, Agent, or Firm—Robert D. Atkins

[57] ABSTRACT

A multi-crystal controlled oscillator (10) and method includes a first crystal resonator (11), second crystal resonator (14), oscillator circuit (23), and a switch (29). The switch (29) is coupled between the first crystal resonator (11) and the oscillator circuit (23) and between the second crystal resonator (14) and the oscillator circuit (23), and electrically couples either the first (11) or the second crystal resonator (14) to the oscillator circuit (23) in response to a crystal select input (XTAL SELECT). The oscillator (10) includes a first pull-down FET (72) coupled between the first crystal resonator (11) and an electrical ground (18) and a second pull-down FET (74) coupled between the second crystal resonator (14) and electrical ground (18) such that when the switch (29) electrically couples the first crystal resonator (11) to the oscillator circuit (23) the second pull-down FET (74) electrically grounds the second crystal resonator (14), and when the switch (29) electrically couples the second crystal resonator (14) to the oscillator circuit (23) the first pull-down FET (72) electrically couples the first crystal resonator (11) to the electrical ground (18).

19 Claims, 2 Drawing Sheets

METHOD AND APPARATUS FOR SWITCHING CRYSTALS IN A CRYSTAL CONTROLLED OSCILLATOR

FIELD OF THE INVENTION

This invention relates in general to oscillators, and more particularly, to crystal controllable oscillators.

BACKGROUND OF THE INVENTION

Crystal controllable oscillators that are suited to be manufactured in monolithic integrated circuit form and operated as voltage controlled oscillators (VCOs) are well known to those skilled in the art. For example, U.S. Pat. No. 4,571,588 describes such an oscillator. The oscillator circuit disclosed in the '588 patent requires only one additional external pinout from the integrated circuit for connection to an external crystal resonator network. The '558 oscillator includes an oscillation sustaining feedback loop comprising a pair of integrators connected between the input and the output of a differential amplifier and introduces the correct phase shift therebetween to maintain oscillation.

An improved integrated crystal controlled oscillator having a simplified structure to increase manufacturing yields and decrease production costs was described in U.S. Pat. No. 4,646,033. The '033 oscillator has improved frequency stability and the ability to drive emitter-coupled-logic (ECL) loads. The '033 patent is to the same inventor and same assignee as the present patent application. A feature of the '033 oscillator is that a frequency adjusting circuit is connected to the output of a second amplifier. The frequency adjustment circuit introduces variable phase shift within the feedback loop to force the frequency of the crystal to change, thereby permitting the oscillator to be operated as a VCO.

The need exists to permit the switching of crystals via bus in a multiple crystal application, such as a video capture or picture-in-picture (PIP) video system while preserving one external pin per crystal design.

DETAILED DESCRIPTION OF THE DRAWINGS

Accordingly, it is an advantage of the present invention to provide a oscillator circuit method and apparatus that requires only one additional external pinout from an integrated circuit for connection to an external crystal resonator network. It is a further advantage of the present invention to provide an integrated crystal controlled oscillator having a simplified structure to increase manufacturing yields to decrease production costs. It is a further advantage of the present invention to provide improved frequency stability and the ability to drive emitter-coupled-logic (ECL) loads. It is still further an advantage of the present invention to be operable as a VCO if coupled to a frequency adjusting circuit. It is still further an advantage of the present invention to permit the switching of crystals via bus in a multiple crystal application, such as a video capture or picture-in-picture (PIP) video system.

The above and other features and advantages of the present invention will be better understood from the following detailed description taken in conjunction with the accompanying drawings.

Figure 1:
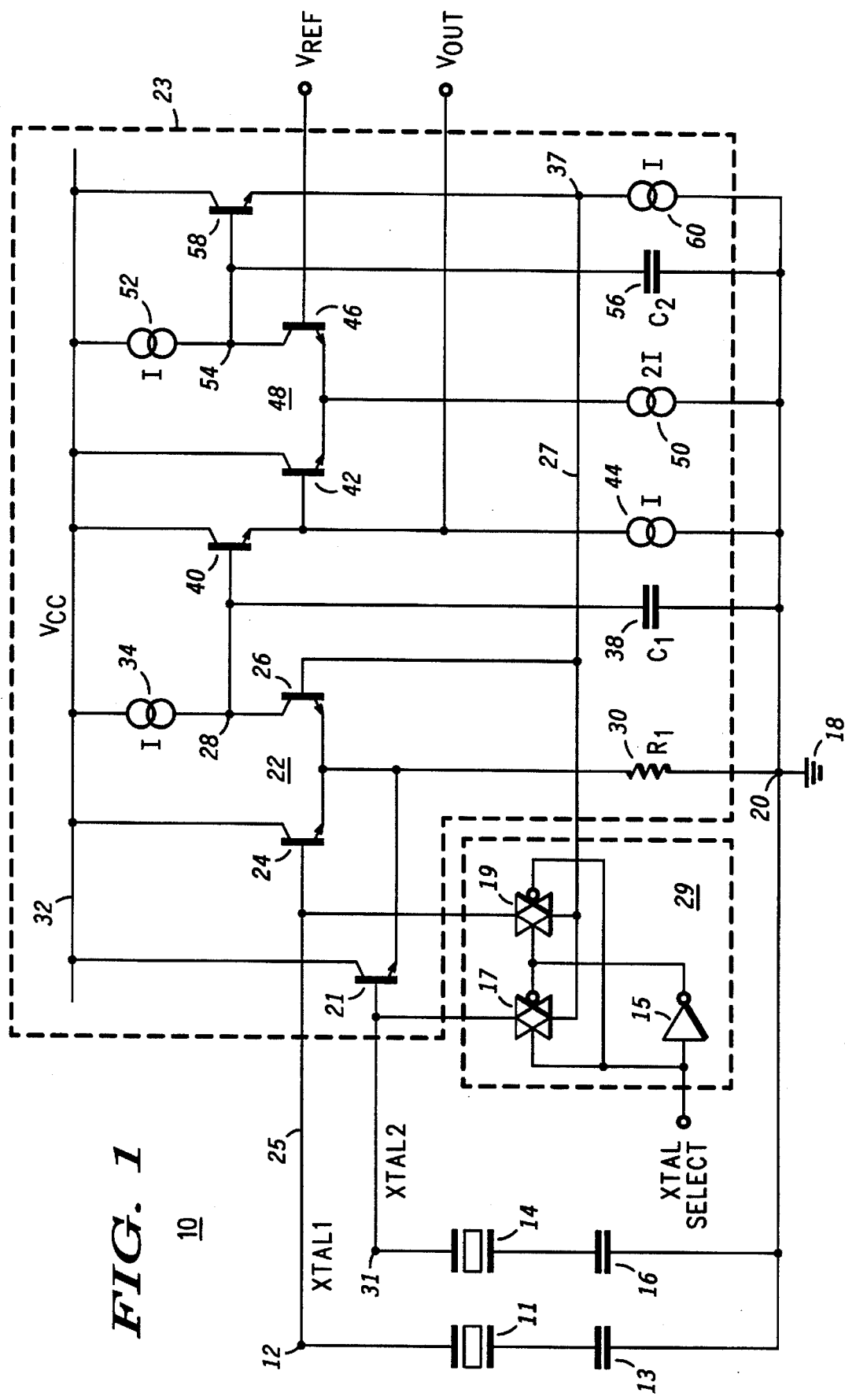
In FIG. 1, there is shown a schematic diagram illustrating a dual crystal oscillator in accordance with a preferred embodiment of the invention; and In FIG. 2, there is shown a schematic diagram illustrating a dual crystal switch suitable for use in the dual crystal oscillator in FIG. 1 in accordance with a preferred embodiment of the invention.

In FIG. 1, there is shown a schematic diagram illustrating a dual crystal oscillator in accordance with a preferred embodiment of the invention. While the specific embodiment illustrated uses two crystals, the method and apparatus may be generalized to more than two crystals. Furthermore, applications of the method and apparatus shown schematically in FIG. 1 can include use in PIP systems—e.g., selecting a crystal related to a sub-carrier associated with the European standard versus the U.S. standard, etc. The apparatus schematically illustrated in FIG. 1 can also be made in monolithic integrated circuit form.

Oscillator 10 in FIG. 1 is a multi-crystal controlled oscillator and requires only one additional external terminal 12 for crystal 11 or terminal 31 for crystal 14. Crystal 11 and crystal 14 comprise first and second crystal resonators for oscillator 10, respectively. Crystal 14 is connected in series with capacitor 16 to electrical ground 18 at node 20. Similarly, crystal 11 is connected in series with capacitor 13 to electrical ground at node 20. Terminal 12 (providing connection XTAL1 to a second side of crystal 11 ) and terminal 31 (providing connection XTAL2 to a second side of crystal 14 are coupled to switch 29. Switch 29 provides the means for the oscillator to switch between crystal 11 and crystal 14, and comprises transmission gates 17 and 19, as well as amplifier 15.

The crystal selection input (XTAL SELECT) to switch 29 in FIG. 1 is input to amplifier 15. The output of amplifier 15 (an inverted, amplified XTAL SELECT) is coupled between the inverted input of transmission gate 17 and the non-inverted input of transmission gate 19. The inverted input of transmission gate 19 is coupled to the non-inverted input of transmission gate 17, as well as to the XTAL SELECT input. Terminal 12 is coupled to the input to transmission gate 19 and terminal 31 is coupled to the input to transmission gate 17. The outputs of transmission gates 19 and 17 are coupled together as switch output 27.

Terminal 31 in FIG. 1 is also coupled to the base of transistor 21. The collector of transistor 21 is coupled to power supply conductor 32 (at operating potential Vcc) and the emitter of transistor 21 is coupled to a first side of resistor 30. A first amplifier 22, comprising differentially connected transistors 24 and 26, has as input the base of transistor 24 and as output, node 28. The base of transistor 24 is coupled to terminal 12 at switch output 25 (XTAL1 input). The emitters of transistors 24 and 26 are connected to the emitter of transistor 21, as well as through resistor 30 to electrical ground 18. The collector of transistor 24 is directly connected to power supply conductor 32 at Vcc while a current I is supplied to node 28 and the collector of transistor 26 from current source 34. The base of transistor 26 is coupled to switch output 27 and to node 37.

A first integrator, comprising capacitor 38, is coupled between node 28, comprising an output of amplifier 22, and electrical ground at node 20. In conjunction with the high impedance output of transistor 26, this introduces a ninety degree lag in the phase of the voltage appearing at the output of amplifier 22. The output of amplifier 22 voltage signal is supplied to the base of emitter follower configured transistor 40 and appears at the base of transistor 42, as well as across current source 44, without any phase shift.

Transistor 42 is connected differentially with transistor 46, forming a second differential amplifier 48. The emitters of transistors 42 and 46 are connected via current source 50 (producing 2I) to electrical ground 18 at node 20. The collector of transistor 42 is directly coupled to power supply conductor 32 whereas the collector of transistor 46 is coupled thereto via current source 52 (producing I) to power supply conductor 32. Differential amplifier 48 functions as a second amplifier the input of which corresponds to the base of transistor 42. An output of amplifier 48 is supplied at node 54 at the collector of transistor 46. A direct current (DC) bias voltage, Vref, is supplied to the base of transistor 46.

A second integrator comprising capacitor 56 is coupled between output node 54 and electrical ground 18 at node 20, which, in conjunction with the high collector impedance of transistor 46, produces a ninety degree lag in the phase of the voltage developed thereacross. This voltage is applied to the base of the emitter follower configured transistor 58 to node 37. Node 37 is coupled via current source 60 to electrical ground 18 at node 20. Node 37 is also connected to the base of transistor 26 and to the base of transistor 24 through switch 29.

The FIG. 1 connection from the output of amplifier 22 through amplifier 48 back to the input of amplifier 22, including the capacitors 38 and 56, provides a feedback loop for sustaining oscillations, as explained below. For explanation purposes, it will be assumed that oscillator 10 is in a quiescent oscillating state. Further, it is assumed that the phase of the oscillating signal appearing at node 37 is zero degrees. In order to sustain oscillations, the feedback loop described above must provide positive feedback from node 37 through amplifiers 22 and 48 via emitter follower transistors 40 and 58 back to node 37, whereby the signal appearing at the emitter of transistor 58 has zero phase.

In the quiescent oscillating condition using crystal 14 in FIG. 1 coupled into the circuit, oscillator 10 will oscillate at the resonant frequency of crystal 14. As is explained below, a second mode of operation of the oscillator 10 is to couple crystal 11 into the circuit in place of crystal 14. The functioning of the circuit remains the same, but the oscillator 10 will oscillate at the resonant frequency of crystal 11, since crystal 11 is coupled into the circuit in place of crystal 14, as explained below. If the input XTAL SELECT is such that transmission gate 19 is on, then transmission gate 17 is off, and crystal 11 is actively coupled into the oscillator 10 in FIG. 1. Conversely, if the input to XTAL SELECT is such that transmission gate 19 is off, then transmission gate 17 is on, and crystal 14 in FIG. 1 is actively coupled into the resonator circuit transmission. Thus, switch 29 alternatively electrically switches or couples either crystal 11 (the first crystal resonator) or crystal 14 (the second crystal resonator) to the oscillator circuit 23 in response to the XTAL SELECT input to switch 29.

Figure 2:
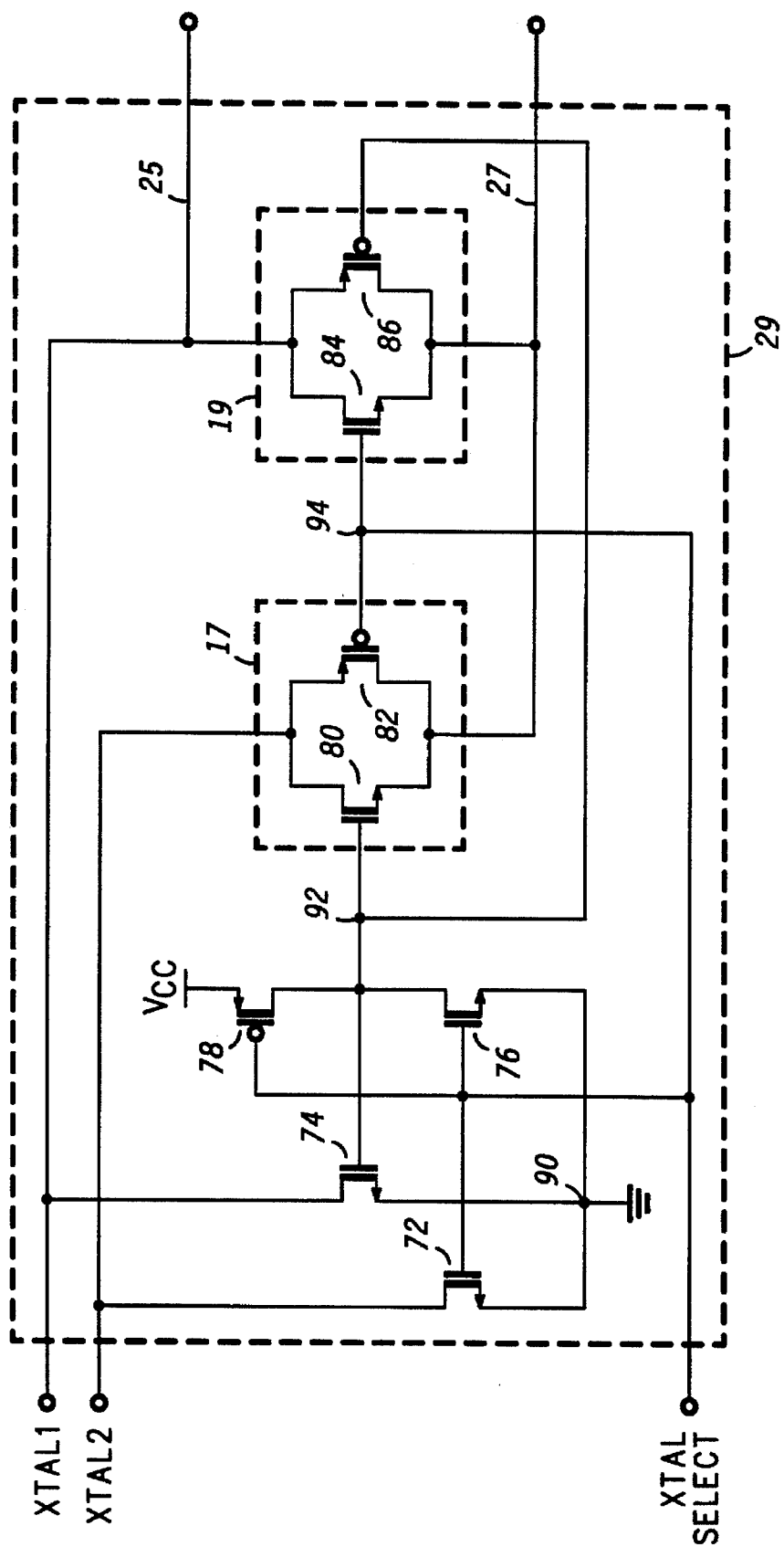

Note in FIG. 2 that field effect transistor (FET) 72 provides a means to pull down to zero the potential difference across transmission gate 17 when transmission gate 19 is on, and FET 74 provides a means to pull down to zero the potential difference across transmission gate 19 when transmission gate 17 is on. Such a pull-down scheme minimizes or precludes capacitive interference for structures on adjacent semiconductor chip pins in a device in which the present method and apparatus can be implemented.

For illustrative purposes, the functionality of the oscillator circuit 10 in FIG. 1 will be explained for the example of crystal 14 coupled into the circuit, with crystal 11 decoupled from the oscillator 10 by switch 29. In such a state, crystal 14 and capacitor 16 provide a short circuit path to electrical ground of any oscillation signals appearing at the base of transistor 24. Thus, any voltage developed across current source 60 at the oscillation frequency is inverted through transistor 26 and appears at node 28 at a phase of 180 degrees out of phase with respect to the oscillation signal established at node 37

Capacitor 38 produces a voltage thereacross that lags the phase of the voltage produced at the collector of transistor 26 by ninety degrees, hence, at the phase of positive ninety degrees with respect to the voltage signal developed at node 37. Emitter follower transistor 40 level shifts the voltage applied to the base thereof and provides a voltage across current source 44 that has the same phase as the voltage developed across capacitor 38. Therefore, the voltage supplied to the base of transistor 42 has a phase that is at a positive ninety degrees with respect to the voltage at node 37.

The voltage produced at the collector of transistor 46 is in phase with the voltage supplied to the base of transistor 42. A voltage is developed across capacitor 56 that lags the phase of the voltage at the collector of transistor 46 by ninety degrees and is therefore in phase with the voltage signal developed at node 37. Emitter follower transistor 58 voltage level shifts the voltage supplied to its base to provide a voltage at node 37 that is in phase with the assumed oscillating signal. Thus, oscillation will be maintained by oscillator 10 at the resonant frequency of crystal 14 as the feedback loop provides 360 degrees of phase shift about the loop.

Negative DC feedback is used to set the quiescent voltage level at the emitter of transistor 58 to Vref by setting all of the bases of transistors 24, 26, 42, and 46 to the same voltage. If the voltage at the base of transistor 46 should increase, the negative feedback loop causes the potential at the base of transistor 58 to decrease. This produces a corresponding decrease in the potential at node 37 and at the bases of transistors 24 and 26. Subsequently, the voltage at the base of transistor 40 will increase, thereby increasing the voltage applied at the base of transistor 42 until the latter balances the increase in the bias potential at the base of transistor 46. The negative DC feedback loop therefore sets the DC operating condition of oscillator 10. By setting the current flow through resistor 30 to a value of 2 times I, all of the bases of transistors 24, 26, 42, and 46 are set to the voltage Vref, comprising the bias potential.

As described above, oscillator 10 can operate at the fixed resonant frequency of crystal 14, or at the fixed resonant frequency of crystal 11, depending upon which crystal is coupled to node 37 of oscillator 10. If the input to amplifier 15 (XTAL SELECT) is such that transmission gate 19 is on, then transmission gate 17 is off, and crystal 11 is actively coupled into the oscillator 10 through transmission gate 19 to node 37. Conversely, if the input to amplifier 15 (XTAL SELECT) is such that transmission gate 19 is off, then transmission gate 17 is on, and crystal 14 is actively coupled into the resonator circuit transmission gate 17 to node 37.

Oscillator 10 may be used as a voltage controlled oscillator (VCO) by introducing a variable portion of the oscillation signal in quadrature to the main signal path to force the crystal to shift frequency. Such a method and apparatus is described in U.S. Pat. No. 4,646,033, entitled "Crystal Controlled Oscillator," by the same inventor and assigned to the same assignee as the present application, herein incorporated by reference.

In FIG. 2, there is shown a schematic diagram illustrating a dual crystal switch 29 suitable for use in the dual crystal oscillator in FIG. 1 in accordance with a preferred embodiment of the invention. Switch 29 has three inputs, i.e., XTAL1, XTAL2, and XTAL SELECT, the first two of which comprise connections to crystal 11 and crystal 14, respectively, and the latter the selection input for choosing crystal 11 or 14.

The drain of FET 72 in FIG. 2 is coupled to the XTAL2 input to switch 29 and the source of FET 72 is coupled to electrical ground at node 90. The drain of FET 74 is coupled to the XTAL1 input to switch 29 and the source of FET 74 is coupled to electrical ground at node 90. The base of FET 72 is coupled to the base of FET 76. The base of FET 76 is also coupled to the inverted base of FET 78. The source of FET 78 is coupled to the applied operating potential Vcc. The drain of FET 78 is coupled to the drain of FET 76, and the source of FET 76 is coupled to electrical ground at node 90. The base of FET 74 is coupled to the drain of FET 76 and to node 92.

Transmission gate 17 in FIG. 2 comprises FETs 80 and 82, and transmission gate 19 in FIG. 2 comprises FETs 84 and 86. The drain of FET 80 is coupled to the source of FET 82 and the common connection is coupled to the XTAL2 input. The source of FET 80 is coupled to the drain of FET. The base of FET 80 is coupled to node 92.

Similarly, transmission gate 19 in FIG. 2 comprises FETs 84 and 86. The drain of FET 84 is coupled to the source of FET 86 and the common connection is coupled to the XTAL1 input, as well as to output 25. The source of FET 84 is coupled to the drain of FET 86, and the common connection is coupled to the common source-to-drain connection of FETs 80 and 82, as well as to output 27. The inverted base of FET 82 is coupled to node 92. In a preferred embodiment of the present invention, the impedance of switch 29 components approximates the resistance of the feedback resistor, resistor 36, in the '033 patent referred to above.

As described above, oscillator 10 in FIG. 1 can operate at the fixed resonant frequency of crystal 14, or at the fixed resonant frequency of crystal 11, depending upon which crystal is actively coupled to node 37 of oscillator 10. Applied to the switch 29 in FIG. 2, if the input XTAL SELECT is such that transmission gate 19 is on, then transmission gate 17 is off, and crystal 11 is actively coupled into the oscillator 10 in FIG. 1. Conversely, if the input to XTAL SELECT is such that transmission gate 19 is off, then transmission gate 17 is on, and crystal 14 in FIG. 1 is actively coupled into the resonator circuit transmission. Note in FIG. 2 that FET 72 pulls down to zero the potential difference across transmission gate 17 when transmission gate 19 is on, and FET 74 pulls down to zero the potential difference across transmission gate 19 when transmission gate 17 is on. Such a pull-down scheme minimizes or precludes capacitive interference for structures on adjacent semiconductor chip pins in a device in which the present method and apparatus are implemented.

Thus, there has been provided, in accordance with an embodiment of the invention, a method and apparatus for switching crystals in a crystal controlled oscillator that fully satisfies the aims and advantages set forth above. The present method and apparatus preserve the design of one external pinout per crystal for connection to an external crystal resonator network. The present method and apparatus also provide a simplified structure to increase manufacturing yields and to decrease production costs, as well as provide improved frequency stability and the ability to drive emitter-coupled-logic (ECL) loads. The present method and apparatus also can be used in conjunction with a frequency adjusting circuit to permit the oscillator to be operated as a VCO. The present method and apparatus also permit the switching of crystals in a video capture or picture-in-picture (PIP) video system via bus control.

While the invention has been described in conduction with a specific embodiment, many alternatives, modifications, and variations will be apparent to those of ordinary skill in the art in light of the forgoing description. Accordingly, the invention is intended to embrace all such alternatives, modification, and variations as fall within the spirit and broad scope of the appended claims.

What is claimed is:

1. A multi-crystal controlled oscillator comprising:
   a first crystal resonator;
   a second crystal resonator;
   an oscillator circuit; and
   a switch coupled between the first crystal resonator and the oscillator circuit and between the second crystal resonator and the oscillator circuit, wherein the switch includes an impedance approximately equivalent to a feedback resistance for electrically coupling either the first crystal resonator to the oscillator circuit or the second crystal resonator to the oscillator circuit in response to a crystal select input to the switch.

2. A multi-crystal controlled oscillator as claimed in claim 1, wherein the switch comprises:
   a first transmission gate with a first input coupled to the first crystal resonator and an inverted input coupled to the crystal select input; and
   a second transmission gate with a first input coupled to the second crystal resonator, a second input coupled to the crystal select input, and an inverted input coupled to a second input of the first transmission gate.

3. A multi-crystal controlled oscillator as claimed in claim 2, wherein the switch further comprises an amplifier comprising:
   an input coupled to the crystal select input; and
   an output coupled to the inverted input of the second transmission gate and to the second input of the first transmission gate.

4. A multi-crystal controlled oscillator as claimed in claim 1, wherein the oscillator circuit comprises:
   a first amplifier having an input to which is coupled the first crystal resonator; and
   a feedback loop coupled between an output and the input of the first amplifier, the feedback loop for sustaining oscillations within the multi-crystal controlled oscillator.

5. A multi-crystal controlled oscillator as claimed in claim 4, wherein the first amplifier comprises a first differential amplifier having first and second inputs and an output, wherein the first input and the output comprise the input and output of the first amplifier, respectively.

6. A multi-crystal controlled oscillator as claimed in claim 4, wherein the feedback loop comprises a first integrator coupled to the output of the first amplifier.

7. A multi-crystal controlled oscillator as claimed in claim 6, wherein the feedback loop further comprises a second amplifier having an input and an output, wherein the input of the second amplifier is coupled to the output of the first amplifier.

8. A multi-crystal controlled oscillator as claimed in claim 7, wherein the feedback loop further comprises a second integrator coupled to the output of the second amplifier, wherein the output of the second amplifier is coupled to the input of the first amplifier.

9. A multi-crystal controlled oscillator as claimed in claim 7, wherein the second amplifier further comprises a second differential amplifier having first and second inputs and an output, wherein the first input and the output comprise the input and output, respectively, of the second amplifier, and wherein the second input is coupled to a bias potential.

10. A multi-crystal controlled oscillator as claimed in claim 9, wherein the second integrator comprises a second capacitor connected between the output of the second amplifier and a first power supply conductor.

11. A multi-crystal controlled oscillator as claimed in claim 7, wherein the input of the second amplifier is coupled to the output of the first amplifier through a first emitter follower configured transistor.

12. A multi-crystal controlled oscillator as claimed in claim 11, wherein the output of the second amplifier is coupled to the input of the first amplifier through a second emitter follower configured transistor.

13. A multi-crystal controlled oscillator as claimed in claim 6, wherein the first integrator comprises a capacitor coupled between the output of the first amplifier and a first power supply conductor to which is supplied an electrical ground.

14. A multi-crystal controlled oscillator, comprising:

a first crystal resonator;

a second crystal resonator;

an oscillator circuit;

a switch coupled between the first crystal resonator and the oscillator circuit and between the second crystal resonator and the oscillator circuit, wherein the switch electrically couples either the first crystal resonator to the oscillator circuit or the second crystal resonator to the oscillator circuit in response to a crystal select input to the switch;

a first pull-down means coupled between the first crystal resonator and an electrical ground; and a second pull-down means coupled between the second crystal resonator and the electrical ground such that when the switch electrically couples the first crystal resonator to the oscillator circuit the second pull-down means electrically grounds the second crystal resonator and when the switch electrically couples the second crystal resonator to the oscillator circuit the first pull-down means electrically grounds the first crystal resonator.

15. A method for switching a multi-crystal controlled oscillator, the method comprising the steps of:

providing a first crystal resonator, a second crystal resonator, an oscillator circuit, and a switch; and switching an impedance approximately equivalent to a feedback resistance alternatively between the first crystal resonator and the oscillator circuit and between the second crystal resonator and the oscillator circuit in response to a crystal select input to the switch.

16. A method for switching a multi-crystal controlled oscillator as claimed in claim 15, wherein the step of switching comprises the step of alternatively switching on a first transmission gate and switching off a second transmission gate or switching off the first transmission gate and switching on the second transmission gate.

17. A method for switching a multi-crystal controlled oscillator as claimed in claim 16, wherein the step of switching further comprises the step of sustaining oscillations within the multi-crystal controlled oscillator using a feedback loop.

18. A method for switching a multi-crystal controlled oscillator as claimed in claim 16, wherein the step of switching further comprises the step of integrating an output signal of a first amplifier.

19. A method for switching a multi-crystal controlled oscillator as claimed in claim 18, wherein the step of switching further comprises the step of integrating an output signal of a second amplifier.

* * * * *